United States Patent
French et al.

(10) Patent No.: US 8,577,061 B2
(45) Date of Patent: Nov. 5, 2013

(54) POWER SUPPLY FOR LIMITED POWER SOURCES AND AUDIO AMPLIFIER USING POWER SUPPLY

(75) Inventors: John B. French, Caledon East (CA); Andrew John Mason, Bolton (CA)

(73) Assignee: Audera Acoustics Inc., Caledon East (CA)

( * ) Notice: Subject to any disclaimer, the term of this patent is extended or adjusted under 35 U.S.C. 154(b) by 1080 days.

(21) Appl. No.: 12/175,573

(22) Filed: Jul. 18, 2008

(65) Prior Publication Data

US 2009/0016549 A1    Jan. 15, 2009

Related U.S. Application Data

(60) Provisional application No. 60/774,545, filed on Feb. 21, 2006, provisional application No. 60/760,946, filed on Jan. 23, 2006.

(51) Int. Cl.
*H03F 21/00* (2006.01)

(52) U.S. Cl.
USPC .......................................... 381/120; 323/299

(58) Field of Classification Search
USPC ........ 381/120, 28, 123, 55, 323; 330/10, 297, 330/273; 323/299, 276, 224, 282, 313, 317, 323/315

See application file for complete search history.

(56) References Cited

U.S. PATENT DOCUMENTS

| | | | | |
|---|---|---|---|---|
| 5,247,239 | A  * | 9/1993 | Yamamura et al. | 323/272 |
| 5,834,977 | A  * | 11/1998 | Maehara et al. | 330/297 |
| 6,741,715 | B2 * | 5/2004 | Andersen | 381/323 |
| 2006/0028186 | A1* | 2/2006 | Yan | 323/225 |
| 2007/0257645 | A1* | 11/2007 | Nishino | 323/276 |

* cited by examiner

*Primary Examiner* — Lao Lun-See
(74) *Attorney, Agent, or Firm* — Bereskin & Parr LLP/S.E.N.C.R.L., s.r.l.

(57) ABSTRACT

A power supply for limited power sources and an audio amplifier using the power supply comprising power sources to provide an output power signal that can be used by load with a high peak to average power requirement ratio. When such power sources are used to power devices that have a high peak to average power consumption, the average power output of the device is severely limited if the peak power is kept below the power supply limits of the limited power source.

9 Claims, 6 Drawing Sheets

POWER SUPPLY FOR LIMITED POWER SOURCES AND AUDIO AMPLIFIER USING POWER SUPPLY

FIELD

This invention relates to power supplies for use with limited power sources. Some embodiments also relate to amplifiers using such power supplies.

BACKGROUND

Many power sources are capable of providing a limited power level. Such power sources may be called power limited power sources or power limited sources. When such power sources are used to power devices that have a high peak-to-average power consumption, the average power output of the device can be severely limited if the peak power draw must be kept below the power supply limits of the limited power source.

An example of a device that typically has a high peak-to-average power consumption is an audio speaker. In modern computer systems, and in many other devices that include a speaker, it can be desirable to power speakers from a limited power source.

For example, many computer users prefer to use speakers that receive both an audio signal and power through a single connection such as a USB port. A USB port can provide only 2.5 watts of power and is an example of a limited power source.

In some audio systems, it is desirable to transmit both an audio signal and power to a speaker across an Ethernet cable or other connection that is capable of carrying only a limited amount of power. An Ethernet cable can carry only a limited power level, typically due to current limitations. The length of an Ethernet cable will limit the power delivered to a device coupled to a power source through the cable. Typically, a 100 m Ethernet cable (with poor feed resistance) may be able to deliver about 13 watts of power to a device. The power source and Ethernet cable are an example of a limited power source that is unable to supply more than a limited amount of power. In this case, the power limitation is due to the Ethernet connection between the power source and the device.

It is desirable to provide a power supply for use with power limited sources to improve the performance of devices powered by such sources. It is also desirable to provide an audio amplifier including a power supply for use with limited power sources.

SUMMARY

In a first embodiment of the invention provides a power supply for use with limited power sources. The power supply includes a step-up converter that receives a limited power signal at a source from the limited power source. The step-up converter provides a storage power signal to an energy storage element at a storage element terminal. The storage power signal charges the energy storage element, which may typically be or include a capacitor or another reactive device. The energy storage element is selected and charged such that the storage voltage across it is greater than the source voltage. The source voltage at the power input terminal is isolated from the storage voltage and the storage element terminal. In some embodiments, the step-up converter provides this isolation and in other embodiments, a separate isolation element may be used. A power output terminal is coupled to the storage element terminal and an output power signal is provided at the power output terminal.

The power supply may be used to power a load that has a relatively high peak-to-average power requirement. When the load's power demand is relatively low, the load may be powered by the step-up converter. When the load's power demand rises during a high or peak power demand period, the load draws power from the energy storage element.

In another embodiment, the step-up converter includes a source power sensing circuit to monitor the power drawn from the limited power source. The power sensing circuit provides one or more signal relating to the power draw to a power limiter. The power limiter controls the operation of the step-up converter to ensure that the power drawn from the limited power source does not exceed the power limits of the source. In one embodiment, the step-up converter includes a switch and the power limiter is a modulation circuit that controls the operation of the switch. The source power sensing circuit provides an indication of the current drawn from the limited power source. The modulation circuit controls the operation of the switch in response to the current draw. In another embodiment, the source power sensing circuit provides an indication of the source voltage and the modulation circuit controls the switch in response to this voltage. In other embodiments, the source power sensing circuit may provide both current and voltage information to the modulation circuit, which may be configured to use both types of information to control the operation of the step-up converter.

In other embodiments, a step-down converter is coupled between the storage element terminal and the power output terminal to reduce the voltage of the output power signal provided to a load.

In another embodiment, a power supply has a step-up converter with two or more power outputs and provides two or more storage power signals. Each of the storage power signal is coupled to a storage element and charges its respective storage element. One or more of the storage elements may be coupled to a power output terminal to provide an output power signal of different magnitudes. A controller monitors the power requirements of a load coupled to the power output terminals and couples additional storage elements to the power output terminal to increase the power available to the load and to increase the voltage of the output power signal.

Another embodiment of a power supply according to the invention provides split output voltage signals. A positive and a negative output voltage signals are generated and are provided at positive and negative power output terminals. In one embodiment, each of the positive and negative power output signals may be provided at different voltage levels depending on the time-varying power requirements of a load coupled to the power output terminals. In another embodiments, the positive and negative output power signals may be generated as time-varying voltage rails by a tracking supply based on the power requirements of the load.

In another embodiment, there is provided a power supply comprising: power input terminal for receiving an input power signal at a source voltage from a limited power source; an energy storage element for storing energy; a step-up converter coupled to the power input terminal to receive the input power signal and for providing a storage power signal to the energy storage element at a storage voltage, and wherein the step-up converter isolates the source voltage at the input terminal from the storage voltage at the energy storage element; a power output terminal; and wherein the energy storage element is coupled to the step-up converter for receiving power and wherein the energy storage element in coupled to the output terminal for providing an output power signal to a load.

In some embodiments, the step-up converter includes a source power sensing circuit to measure the power level of the input power signal and includes a power limiting circuit to reduce the power level of the input power signal if the power level of the input power signal exceeds a threshold.

In some embodiments, the threshold is chosen based on the power supply limitations of the limited power source.

In some embodiments, the threshold is a proportion of the power rating of the limited power source.

In some embodiments, the step-up converter includes a power sensing circuit to measure the source voltage, and includes a power limiting circuit to reduce the power level of the input power signal if the source voltage falls below a threshold.

In some embodiments, the power supply further comprises a step-down converter coupled between the energy storage element and the power output terminal, wherein the step-down converter receives power from the energy storage element at the storage voltage and provides output power signal at the power output terminal at a supply voltage, wherein the storage voltage is higher than the supply voltage.

In another embodiment, the present invention provides a power supply comprising: a power input terminal; an first energy storage element for storing energy at a first storage voltage; a second energy storage element for storing energy at a second storage voltage; a two output step-up converter coupled to the power input terminal to receive an input power signal from a limited power source at a source voltage and to provide a first storage power signal to the first energy storage element at the first storage voltage and to provide a second storage power signal to the second energy storage element at a second storage voltage; a power output terminal for providing an output power signal to a load, wherein the first energy storage element is coupled to the power output terminal; a load input signal terminal; and a controller coupled to the load input signal terminal to receive a load power signal and for selectively coupling the second energy storage element to the power output terminal in response to the load power signal.

In some embodiments, the power supply further comprises a switch for coupling the first and second energy storage elements such that when the switch is open, the output power signal is provided by the first energy storage element, and when the switch is closed, the output power signal is provided by both the first and second storage elements, and wherein the controller couples the second energy storage element to the power output terminal by closing the switch.

In another embodiment, the invention provides an audio amplification circuit comprising: a power supply including: a power input terminal a step-up converter coupled to the power input terminal to receive an input power signal at a source voltage from a power limited source; an energy storage block, wherein the step-up converter provides a storage power signal to the energy storage block; one or more power output terminals; a converter; and an audio amplification stage including: one or more audio input terminals; one or more audio amplifiers, wherein each audio amplifier is coupled to the power output terminals to receive the one or more output power signals and is coupled to one of the audio input terminals to receive a corresponding input audio signal, and wherein the audio amplification stage provides an amplified audio signal corresponding to each input audio signal, wherein the converter is coupled: to the energy storage block to draw power from the step-up converter and the energy storage block; to the audio input terminals to receive the input audio signals; and to the power output terminals to provide an output power signal at each of the power output terminals, wherein the magnitude of the output power signal at each of the power output terminals is determined, at least in part, by the magnitude of the input audio signals.

In some embodiments, the converter is a tracking power converter and wherein the power converter generates the output power signals in response to magnitude of the largest of the input audio signals.

In some embodiments, the power converter generates the output power signals corresponding the envelope of the largest of the input audio signals.

In some embodiments, the power converter generates a pair of split rail output power signals.

BRIEF DESCRIPTION OF THE DRAWINGS

Several example embodiments of the present invention will now be described in detail with reference to the drawings, in which.

DESCRIPTION OF EXEMPLARY EMBODIMENTS

Figure 1:
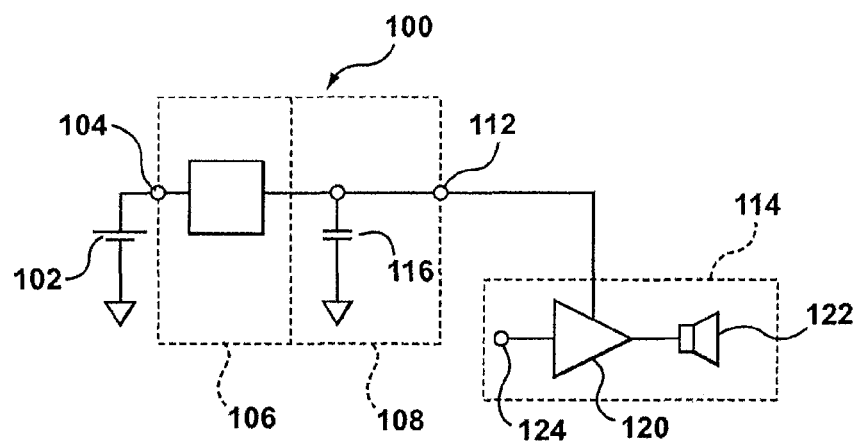
FIGS. 1 and 2 are schematic drawings of several embodiment of a power supplies according to the invention.

Reference is first made to FIG. 1, which illustrates a first embodiment of a power supply 100 for use with a power limited source 102. Power supply 100 is coupled to the power source 102 at a power input terminal 104 and is coupled to a load 114 at a power output terminal 112. Power supply 100 includes a converter block 106 and an energy storage block 108.

Power source 102 provides a power limited DC power signal. Power source 102 may be any type of DC power source. For example, power source 102 may be a battery, an AC-DC converter or adapter that receives power from an AC power source such as a standard utility power supply, a USB port, a power-over-Ethernet power supply or any other type of DC power source.

Converter block 106 is a step-up converter which provides a boosted DC storage power signal at a higher voltage than the power limited DC power signal. In other embodiments, the converter block 106 may be a boost converter, a buck-boost converter, a flyback converter configured as a step-up converter, a forward converter or any other step-up converter that is configured to provide a boosted DC storage power signal with a higher voltage than the input power signal received from the power source 102.

In this embodiment, energy storage block 108 is a capacitor 116, which is charged by the boosted DC storage power signal. Power supply 100 provides a power output signal at a power output terminal 112. Load 114 is coupled to the power output terminal 112 and draws power from the energy storage element 108 at the higher voltage of the boosted DC power signal.

Load 114 has a time-varying power requirement. For example, the peak power demanded by load 114 from power supply 100 may be two or more times greater than the average power demanded from power supply 100. The peak-to-average power ratio of different types of loads can vary.

In this example, load 114 includes a switching audio amplifier 120 and a speaker 122. Switching audio amplifier 120 receives an audio input signal at an audio input terminal 124 and applies an amplified audio signal to speaker 122, which reproduces the amplified audio signal. An audio signal typically has a peak-to-average power ratio of about 8:1 or higher. Switching audio amplifier 120 utilizes sufficient power from capacitor 116 to provide the amplified audio signal. When the power required to generate the amplified audio signal is relatively low (relative to the peak power required), relatively little power is drawn from capacitor 116 and the required power may be drawn directly from the step-up converter 106. When additional power is required by the amplifier to generate louder audio, the additional power may be drawn from capacitor 116. As a result, the amplified audio signal may have a peak power level significantly higher than the average power that can be supplied by the power limited power source 102.

For example, power source 102 may be USB port on a computer. A USB port is able to supply 2.5 watts of power (500 mA at 5 V). If all components in FIG. 1 were ideal, all of this power could be stored in capacitor 116 and the amplified audio signal could have a peak power of 20 watts (assuming an 8:1 peak to average power ratio).

A USB port, and some other connections, can supply both a power limited DC power signal and a data or control signal for a device, such as an input audio signal. In a practical embodiment of a device such as a computer speaker, converter 106, energy storage block 108, an audio amplifier 120 and a speaker 122 may be built into a single device that receives both power and data through a USB or other connection.

In power supply 100, step-up converter 106 is configured to draw no more power from limited power source 102 than the power source is able to deliver. This may be done by building the step-up converter as a flyback converter and by choosing the inductance of the primary winding of the converter, the frequency of the converter's modulator and maximum duty cycle or pulse density based on the limited power source's voltage, effectively limiting the maximum power that can be drawn from the power source. Optionally, a soft start could be used during the start-up of the power supply (and subsequently) to charge capacitor 116 slowly to ensure that the limits of the limited power source 102 are not exceeded.

Figure 2:
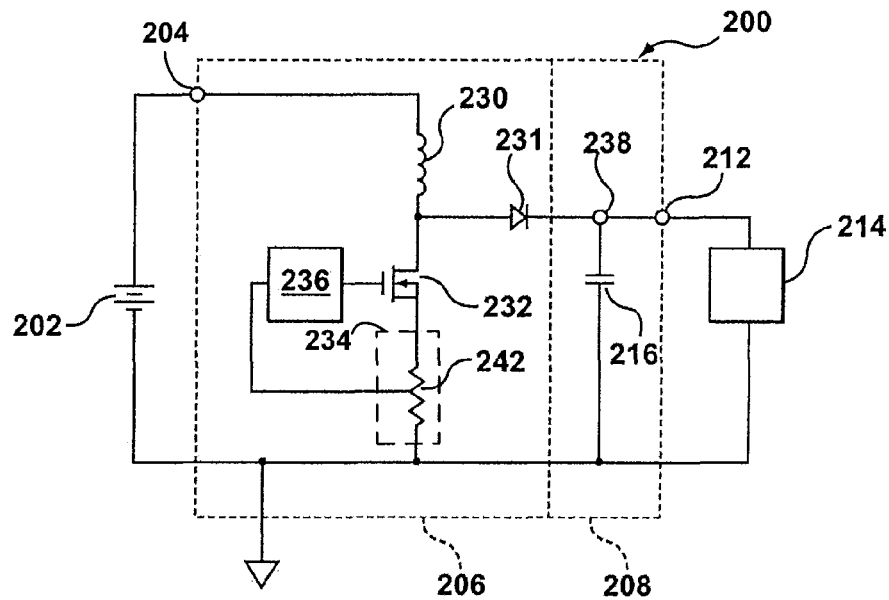

Reference is next made to FIG. 2, which illustrates a second power supply 200. Power supply 200 includes a step-up converter 206, which may be used as a converter block in a power supply, including power supply 100. In this embodiment, step-up converter 206 is a boost converter. Boost converter 206 is a single-ended boost converter and includes an inductor 230, a switch 232, a power sensing circuit 234, a switch controller 236. Boost converter 206 receives power from limited power source 202 at power input terminal 204 at a source voltage and provides a storage power signal at a storage element terminal 238.

In this embodiment, switch 232 is a transistor. Switch controller 236 is a pulse width modulator that opens and closes switch 232. When switch 232 is closed, inductor 230 stores energy from limited power source 102. When switch 232 is open, energy stored in inductor 230 is transferred to capacitor 216 through diode 231, charging the capacitor. Load 214 receives power from capacitor 216.

Switch controller 236 is configured to ensure that the power drawn from limited power source 202 does not exceed the power supply limits of the power source 202. Power sensing circuit 234 includes a current sense resistor 242. With a fixed frequency pulse width modulated controller 236, if the current draw exceeds the power supply threshold (as sensed across the sense resistor), then switch controller 236 reduces the duty cycle of the switch 232, thereby reducing the power drawn from the limited power source 202. The power supply threshold may typically be based on the current supply limits of the power supply at its rated voltage, and will typically be a proportion of the current supply limit to account for transmission losses between the limited power source 202 or other criteria such as a tolerance or margin of error.

Converter 206 operates in a power limiting configuration to store energy in energy storage element 208 without exceeding the power supply limitations of limited power source 202. The power supply limitation of the limited power source 202 may be defined as a maximum current at a rated source voltage. In the example of FIG. 2, switch controller 236 is configured to control switch 232 based on the current drawn from the limited power source. If the energy storage element 208 can be kept fully charged without exceeding the limitations of the limited power source, then switch controller 236 operates converter 206 to do so.

In other embodiments, the switch controller 236 may be configured to operate converter 206 based on any operational characteristics of limited power source 202. For example, some power sources have an effective output source impedance such that as the output current from the power source increases beyond some limit, the output voltage falls. When used with such a power source, power sensing circuit 234 may measure the source voltage at the power input terminal 204. The switch controller may be configured to control the operation of the converter 206 in response to the voltage level. If the output voltage of the power source falls below a power supply threshold, the switch controller may reduce the duty cycle of the switch 232 to reduce the power drawn from the power source 202. For example, switch controller 236 may be a pulse coded modulator and may be configured to control the modulation of switch 232 such that the maximum duty cycle $D=m \times V+b$, where m is a constant that defines a slope between the voltage V at the power input terminal and the duty cycle, and b is a constant which defines an offset. At any particular time, the actual duty cycle d of the switch 232 must be less than the maximum duty cycle D.

In other embodiments, the power sensing circuit 234 may detect both the source and the current draw from the power limited source and the switch controller may combine this information to determine a maximum duty cycle for the switch 232. For example, the maximum duty cycle may be calculated as $D=c-aV-bi$, where a, b and c are constants.

In FIG. 2, the converter is a boost converter. Diode 231 isolates the power input terminal 204 from the storage element terminal 238. In other embodiments, other types of converters may be used. For example, a flyback converter that galvanically isolates the source voltage at the power input terminal from the storage voltage at the storage element terminal 238 could be used.

In some embodiments, it may be desirable to store a relatively large amount of energy in the energy storage element 208. In general, if a load has a higher peak-to-average power requirement, then it is desirable to store a larger amount of energy to supply the transient and relatively high power demands during peak power requirements. To store a larger amount of energy, the size of the capacitor 216 can be increased, or the storage voltage can be increased, or both. In power supply 200, the power output terminal 212 is coupled to the storage element terminal 238. As the voltage at power output terminal rises, the idle power consumption and low power dissipation of the load 214 may increase. To reduce these inefficiencies, in some embodiments, it may be preferable to reduce the voltage of the output power signal at the power output terminal 212.

Figure 3:
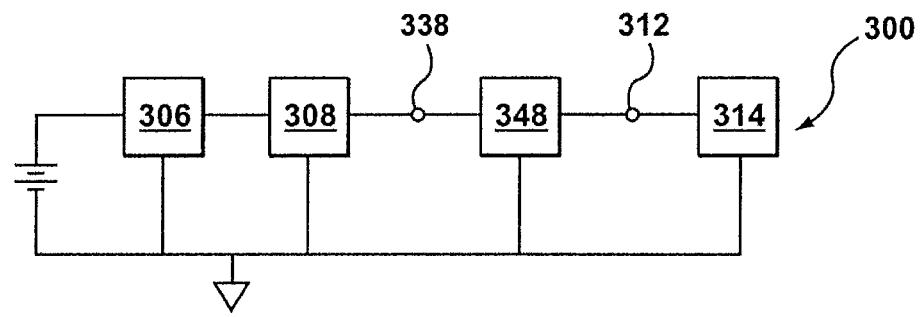
FIG. 3 is a block diagram of another embodiment of a power supply according to the invention.

FIG. 3 illustrates a power supply 300. Power supply is similar to power supplies 100 and 200 and similar reference numerals are used to identify corresponding components. Power supply 300 includes a step-down converter 348, which decouples the storage element voltage at the storage element terminal 338 from the voltage of the output power signal at the power output terminal 312. Step-down converter 348 reduces the voltage of the output power signal. Depending on the nature of the load 314, this may reduce losses in the load.

Step-down converter 348 may be any type of voltage step-down circuit. Preferably, the step-down converter 348 is a high efficiency converter to reduce power losses in the converter. For example, the step-down converter may be implemented as a buck converter or a fly-back converter.

Figure 4:
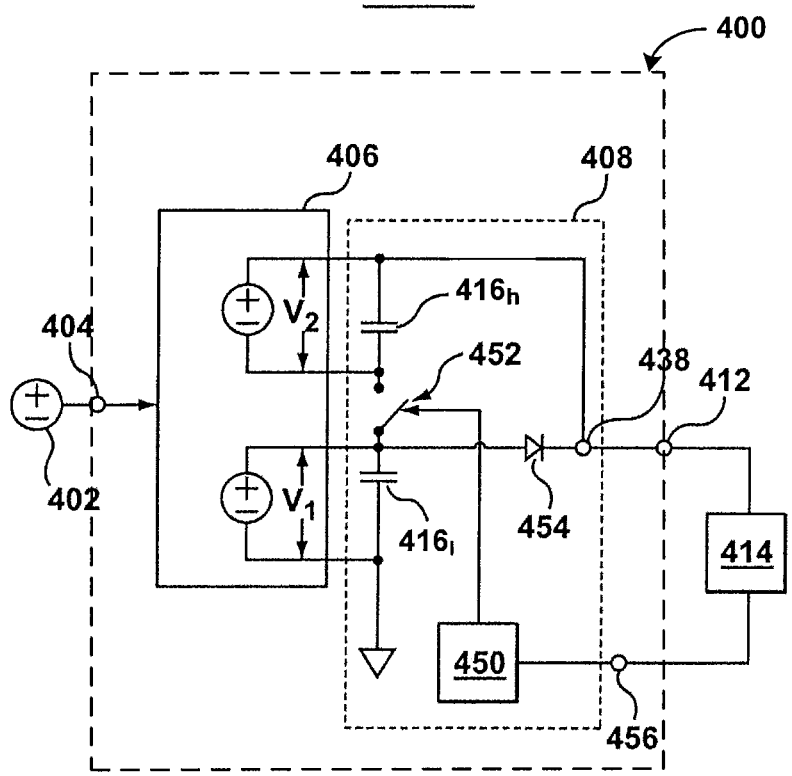
FIGS. 4 to 7 are schematic drawings of other embodiments of power supplies according to the invention.

Reference is next made to FIG. 4, which illustrates a power supply 400. Power supply 400 includes power input terminal 404, a two output step-up converter 406, an energy storage block 408 and a power output terminal 412.

Step-up converter 406 receives an input power signal from limited power source 402. Step-up converter 406 provides two storage power signals $V_1$ and $V_2$. Energy storage block includes two capacitors $416_l$ and $416_h$. Step-up converter 406 provides galvanic or transformer isolation between the limited power source 402 and energy storage block 408. Capacitor $416_l$ is coupled between ground on one side and an output power switch 452 on its second side. The second side of capacitor $416_l$ is also coupled to the storage element terminal 438 through a diode 454. Capacitor $416_h$ is coupled between output power switch 452 and storage element terminal 438. Energy storage block 408 also includes an output power signal voltage controller 450.

Storage power signal $V_2$ is coupled across capacitors $416_h$ and storage power signal $V_1$ is coupled across capacitor $416_l$. Each storage power signal operates to charge its respective capacitor. The two storage power signals may have the same or different voltages. In steady state operation of power supply 400, capacitor $416_l$ will have a voltage $V_l$ across it and capacitor 416h will have a voltage $V_h$ across it.

Controller 450 receives a load power signal at a load power terminal 456. The load power signal is a time varying signal and indicates the power required by the load. Controller 450 operates switch 452 in response to the load power signal by holding switch 452 open when the load power signal indicates that the load requires a power level below a load power threshold and by holding switch 452 closed when the load power signal indicates that the load requires a power level above the load power threshold. When switch 452 is open, capacitor $416_l$ provides an output power signal have a magnitude $V_l$ at the power output terminal 412. When switch 452 is closed, capacitors $416_l$ and $416_h$ are coupled in series and both capacitors collectively provide the output power signal with a magnitude of $V_l+V_h$. Diode $D_1$ prevents any current from flowing back from the power output terminal 438 to capacitor $416_l$.

The load power threshold is selected based on the maximum power level that can be provided to satisfy the load when switch 452 is open and the output power signal is supplied by capacitor $416_l$ only. Controller 450 is responsive to the load power signal to ensure that the output power signal is able to supply the power required by the load (to the maximum power that can be supplied by power supply 400 or the maximum power than can be drawn from source 402).

By reducing the voltage of the output power signal when the power requirements of the load are below the load power threshold, losses in the load can be reduced.

The magnitude of capacitors $416_l$ and $416_h$ and the corresponding storage power signals will define the magnitude of $V_l$ and $V_h$. The selection of these voltage levels may depend on the intended use of a particular power supply. For example, power supply 400 may be used to power an ink jet printer with an idle power consumption that is much less than the printer's operating power consumption. For example, a Canon IP4000 requires approximately 0.5 W of power when idling, but approximately 16 W of power when printing. Capacitors $416_l$ and $416_h$ and the storage power signals may be selected such that $V_l$ is much smaller than $V_h$. Switch 452 can be kept open when the printer is idling and can be closed when the printer is printing. When switch 452 is open, capacitor $416_h$ remains charged at the relatively higher voltage $V_h$, but is not coupled to the load, reducing losses in the load. Capacitor $416_h$ can be quickly coupled to the load to provide higher power when the load requires this (such as during a peak power requirement).

Figure 5:
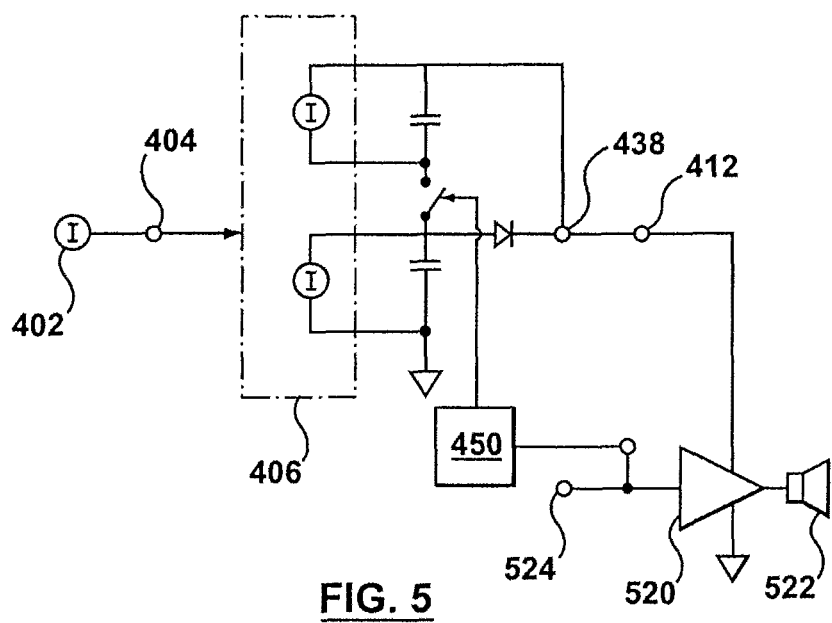

Reference is next made to FIG. 5, which illustrates power supply 400 coupled to an audio amplifier 520. Audio amplifier 520 is a single-ended amplifier and receives the output power signal from power output terminal 412. For example, amplifier 520 may have a bridged configuration or may be capacitively coupled to avoid introducing a DC component to its speaker 522. Amplifier 520 receives an input audio signal at audio input terminal 524. Amplifier 520 amplifies the audio signal and reproduces it at speaker 522. Audio input terminal 524 is coupled to the load power terminal 456 and the input audio signal serves as the load power signal.

Controller 450 monitors the input audio signal. When the magnitude of the input audio signal indicates that the amplifier will require more power than can be delivered by capacitor $416_l$, controller 450 closes switch 452. Otherwise, switch 452 is held open. Many audio signals have a peak-to-average power ratio of 8:1. Power supply 400 can be configured such that capacitor 416, is able to power the amplifier 520 under most conditions (say, for example, 20% of the amplifier's maximum power output. (At a peak-to-average power ratio of 8:1, the average power level will be about 12.5% of the peak power output when the amplifier is set it its loudest volume.)) If the power required exceeds the 20% threshold, then switch 452 can be closed to provide sufficient power to produce a higher power signal, such as a peak signal.

Optionally, controller 450 may be configured to open and close switch 452 at different thresholds. For example, controller 450 may be configured to close switch 452 if the load power signal indicates that the load requires 90% of the power that capacitor $416_l$ is able to deliver, but may only open switch 452 when the load power signal indicates that the load requires 80% of the power that capacitor 416 can deliver. When the required power is between 80% and 90%, the switch remains in its previous condition. This type of hysteresis reduces the number of times the switch will close and open rapidly if the load is operating in a range close to the load power threshold.

In another embodiment, the controller 450 may implement a time-based hysteresis to maintain switch 452 closed for a minimum time after the load power signal indicates that the switch could be opened. For example, the minimum time may be 10 ms. When switch 452 is closed in response to the load power signal exceeds the load power threshold, it remains closed until at least 10 ms after the load power signal falls below the load power threshold. If after 10 ms, the load power signal is again above the load power threshold, switch 452 remains closed.

Figure 6:
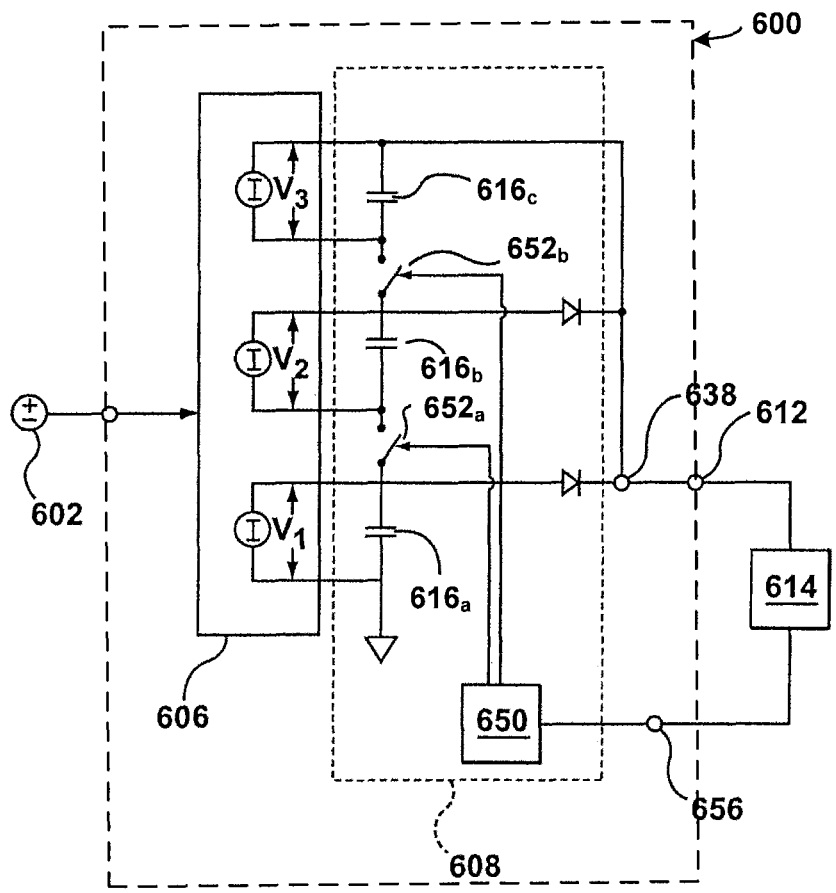

Power supply 400 provides an output power signal with two voltage levels controlled by output power signal voltage controller 450. FIG. 6 illustrates a power supply 600 that receives an input power signal from limited power source 602 and that can produce an output power signal with three voltage levels. Power supply 600 includes a three output step-up converter 606 which produces three storage power signals $V_1$, $V_2$ and $V_3$. Each storage power signal charges a corresponding capacitor $616_a$, $616_b$, $616_c$ in energy storage block 608. Controller 650 monitors a load power signal provided by the load at a load power terminal 656. Controller 650 is configured to operate power supply 600 in one of three configuration depending on the load power signal. If the load power signal is below a first load power threshold, switches $652_a$ and $652_b$ are held open and capacitor $616_c$ provides an output power signal at power output terminal 612, coupled to the storage element terminal 638. If the load power signal is between a first load power threshold and a second power threshold, then switch $652_a$ is closed and switch $652_b$ is open and capacitors $616_a$ and $616_b$ collectively provide the output power signal. If the load power signal exceeds the second power threshold, then switches $652_a$ and $652_b$ are closed and capacitors $616_a$, $616_b$ and $616_c$ collectively provide the output power signal. Depending on the load power signal, the voltage of the output power signal may be at any one of three levels. This concept can be extended to more levels to provide an output power signal with four or more voltage levels. The voltage levels may be configured by selecting the magnitudes of the storage power signals, $V_1$, $V_2$ and $V_3$, and the energy storage capacitors $616_a$, $616_b$ and $616_c$.

Figure 7:
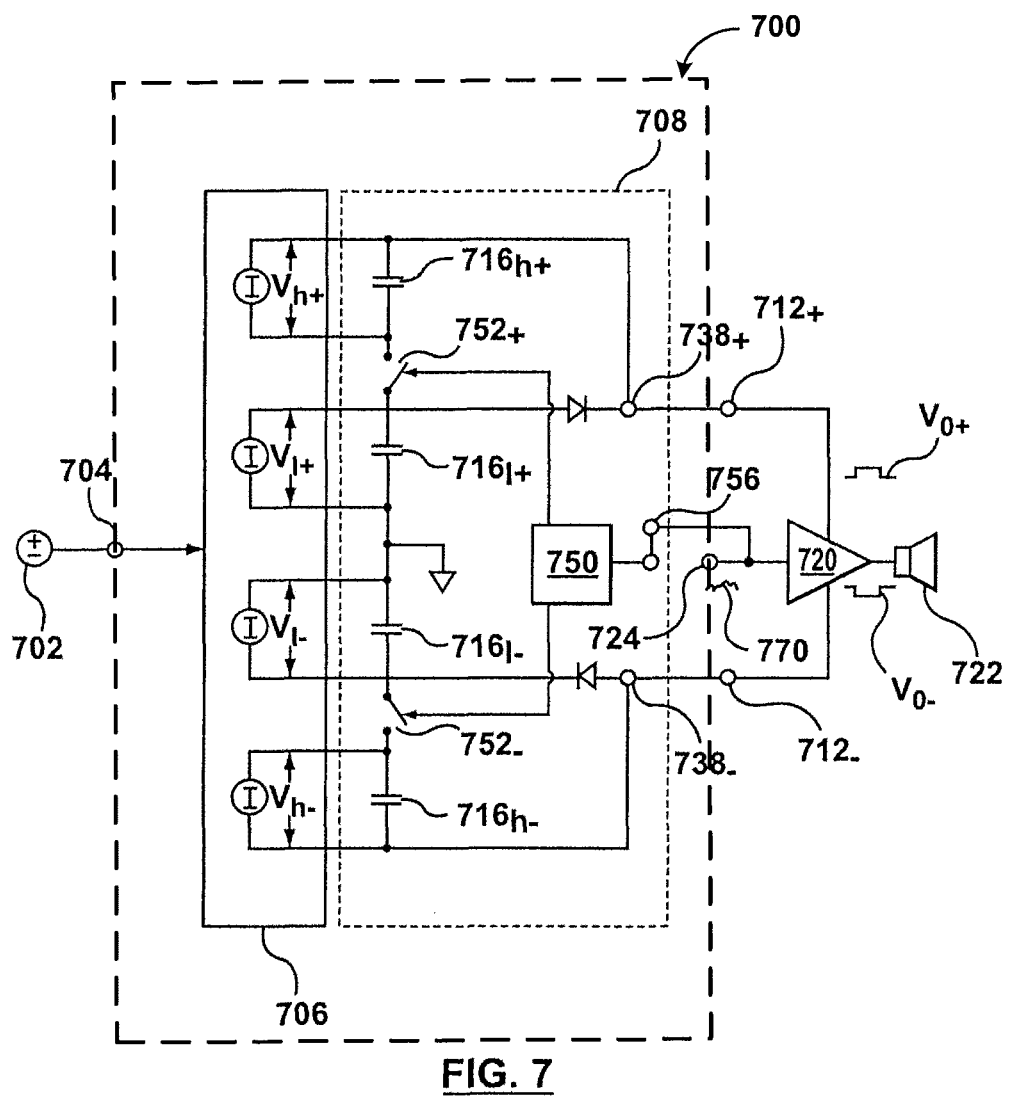

Reference is next made to FIG. 7, which illustrates a power supply 700 that receives an input power signal from limited power source 702 at power input terminal 704. Power supply 700 has a split rail configuration. Power supply 700 has a four output setup converter 706 that provides four storage power signals $V_{h+}$, $V_{l+}$, $V_{l-}$ and $V_{h-}$. The storage power signals respectively charge energy storage capacitors $716_{h+}$, $716_{l+}$, $716_{l-}$ and $716_{h-}$ in energy storage block 708. Switches $752_+$ and $752_-$ operate to control the voltage of a positive output power signal at power output terminal $738_+$, coupled to power output terminal $712_+$, and a negative output power signal at negative power output terminal $738_-$, coupled to power output terminal $712_-$. Controller 750, receiving an audio input signal 770 at a load power terminal 756, operates in a manner analogous to controller 450 in FIG. 5 to control the operation of switches $752_+$ and $752_-$.

Figure 8:
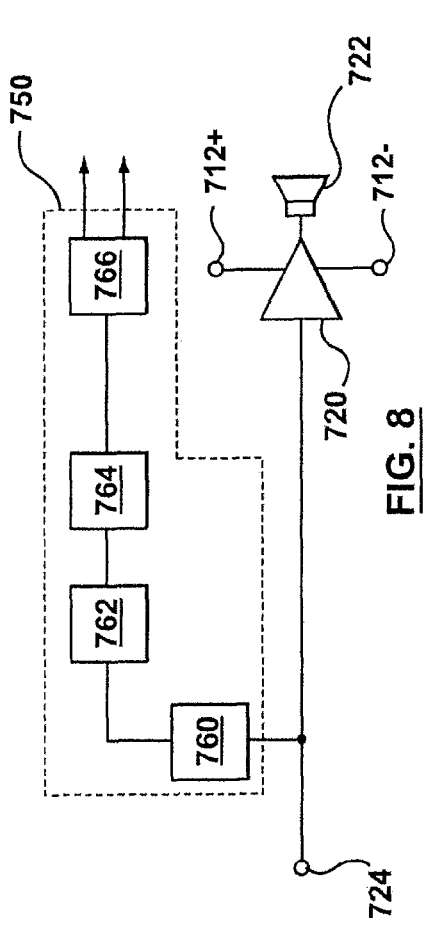
FIG. 8 is a schematic drawing of a controller of the embodiment of FIG. 7.
Figure 9:
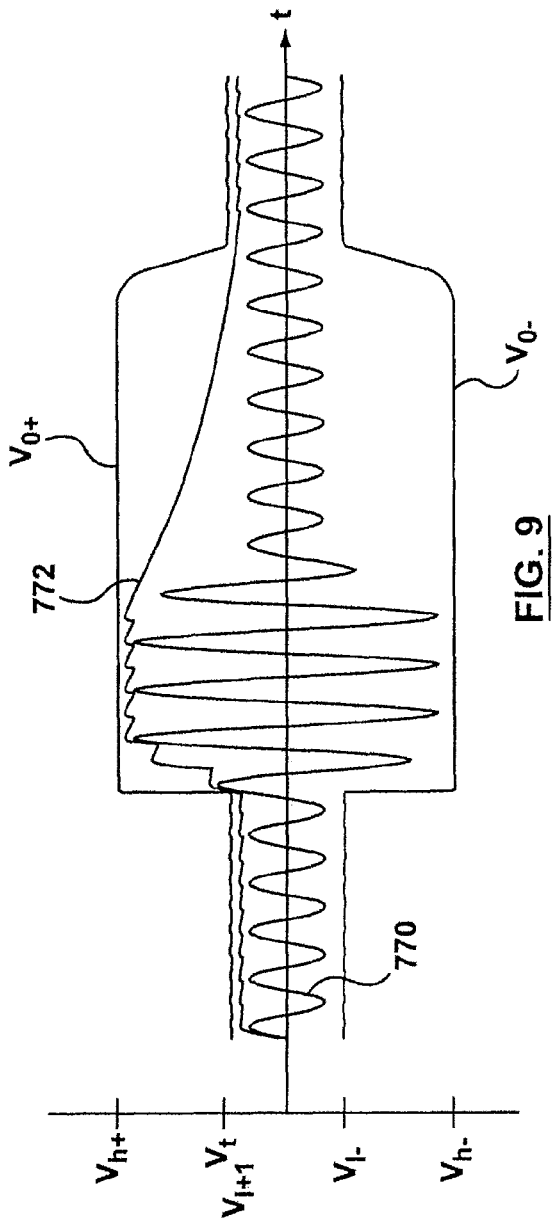
FIG. 9 is a timing drawing illustrating the operation of the power supply of FIG. 7.

Reference is made to FIGS. 7, 8 and 9. FIG. 8 illustrates controller 750 in greater detail. FIG. 9 illustrates the operation of controller 750 and power supply 700.

Controller 750 includes a phase lead block 760, an absolute value block 762, a peak detector 764 and a switching control block 766. Phase lead block 760 is coupled to the audio input terminal 724 to receive the audio input signal 770 and provide a phase advanced version of the audio input signal. Absolute value block 762 and peak detector 764 operate to provide an envelope signal 772 corresponding to the phase advanced audio input signal. When the envelope of the signal is below a load power threshold $V_t$, switches $752_+$ and $752_-$ are open and the output voltage signals $V_{o+}$ and $V_{o-}$ have a magnitude of $V_{l+}$ and $V_{l-}$. When the envelope of the signal exceeds $V_t$, switches $752_+$ and $752_-$ are closed and the output voltage signals $V_{o+}$ and $V_{o-}$ have a magnitude of $V_{h+}$ and $V_{h-}$. ($V_{h+}$ equals the voltage across capacitor $716_{l+}$ and $716_{h+}$.) In FIG. 9, the output voltage signal is drawn on a different scale than the audio input signal and the envelope signal to illustrate the operation of power supply 700. In practice, the output voltage signals $V_{o+}$ and $V_{o-}$ will have magnitude larger than the envelope of the input audio signal by at least the factor of amplification provided by amplifier 720. The amplified audio signal is reproduced by a corresponding speaker 722.

Figure 10:
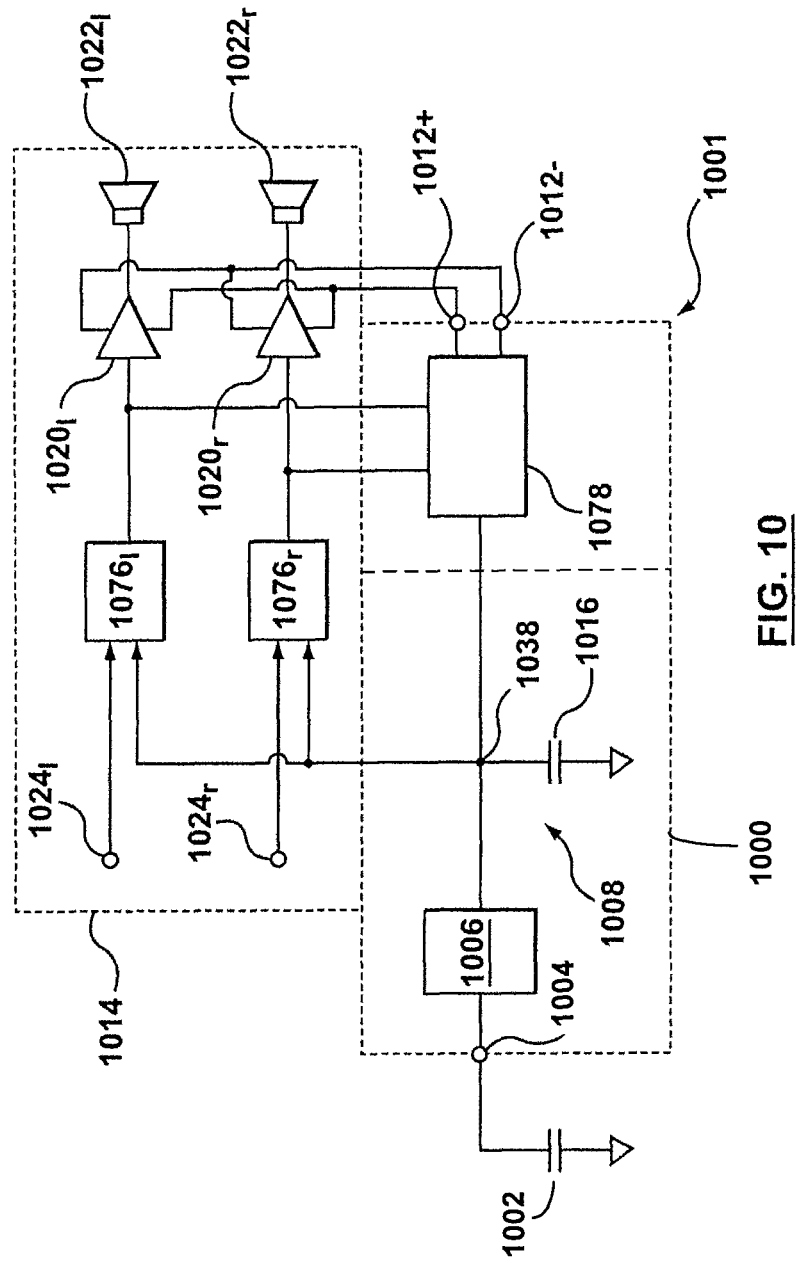
FIG. 10 illustrates a multi-channel audio amplification circuit according to the present invention.

Reference is next made to FIG. 10, which illustrates a two channel audio amplification circuit including a power supply 1000 and an audio amplification block 1014. Power supply 1000 is coupled to a limited power source 1002 to receive an input power signal at power input terminal 1004. Step-up converter 1006 provides a storage power signal that is used to charge one or more energy storage elements in energy storage block 1008.

Two audio input signals are received at audio input terminals $1024_l$ and $1024_r$. Each audio signal is coupled through an automatic gain control (AGC) block $1076_l$ or $1076_r$ to a respective amplifier $1020_l$ or $1020_r$. Each AGC block $1076_l$ or $1076_r$ produces an adjusted audio input signal, which is explained in greater detail below. Each amplifier amplifies its respective adjusted input audio signal and produces a corresponding amplified audio signal. The amplified audio signal is reproduced by a corresponding speaker $1022_l$ or $1022_r$. Each of the amplifiers is powered by split mode power rails $V_+$ and $V_-$ generated by a tracking power supply 1078 at power output terminals $1012_+$ and $1012_-$. The tracking power supply 1078 receives the adjusted input audio signals and generates positive and negative power rails with a sufficient magnitude to power the amplifiers. The tracking power supply 1078 may operate by generating an envelope signal corresponding to the adjusted input audio signal with the greatest magnitude and then generating positive and negative power rails $V_+$ and $V_-$ at a magnitude greater than the largest of the amplified audio signal to be generated by the amplifiers 1020. The single energy storage block 1008 is thus used to power two amplifiers that reproduce two input audio signals. Typically, although not necessarily, the two input audio signals will be corresponding left and right audio signals.

The energy storage elements in energy storage block will typically be capacitors 1016. In operation, the voltage across the capacitors 1016 (i.e. the voltage at storage element terminal 1038) can decline rapidly as power is drawn from them by the load 1014. If excessive power is drawn from the capacitors, the voltage across them can collapse with the result that the tracking power supply 1078 (or a step-down converter as described in relation to power supply 300 (FIG. 3)) cannot maintain the positive and negative power rails $V_+$ and $V_-$ at the desired level. This is most likely to occur during peaks in the amplitude of the amplified audio signal and may result in clipping of the reproduced sound from the speaker. The AGC blocks 1076 can reduce the likelihood of this. Each AGC block monitors the magnitude of its corresponding audio input signal. Each AGC block also monitors the voltage at storage element terminal 1038. If this voltage drops below a threshold, the AGC can reduce the magnitude of the adjusted audio input signal, thereby reducing the voltage levels of the power rails $V_+$ and $V_-$. When the voltage at the storage element terminal 1038 returns above the threshold, the AGC will stop reducing the amplitude of the adjusted input signal. The AGCs are preferably configured to attack quickly enough to avoid collapse of the voltage on the capacitors 2016 and slow enough to avoid excess volume changes in the resulting audio.

The automatic gain controller shown in amplification circuit 1001 may be used with amplifier 100-700. Similarly, the tracking power supply illustrated in amplification circuit 1001 may also be coupled between the storage element terminal and power output terminal in the other power supplies to provide an output power signal that tracks the power requirements of a load.

The present invention has been described here by way of example only. Various modification and variations may be made to these exemplary embodiments without departing from the spirit and scope of the invention, which is limited only by the appended claims.

We claim:

1. A power supply comprising:
a power input terminal for receiving an input power signal at a source voltage from a limited power source;
a step-up converter coupled to the power input terminal to receive the input power signal and to provide a storage power signal at a storage voltage, wherein the storage voltage is higher than the source voltage;
an energy storage element coupled to the step-up converter for receiving the storage power signal and for storing power at the storage voltage; and
a power output terminal coupled to the energy storage element and the step-up converter for providing an output power signal to a load;
wherein the step-up converter isolates the source voltage at the power input terminal from the storage voltage at the energy storage element.

2. The power supply of claim 1 wherein the step-up converter includes a source power sensing circuit to measure the power level of the input power signal and includes a power limiting circuit to reduce the power level of the input power signal if the power level of the input power signal exceeds a threshold.

3. The power supply of claim 2 wherein the threshold is chosen based on power supply limitations of the limited power source.

4. The power supply of claim 2 wherein the threshold is a proportion of a power rating of the limited power source.

5. The power supply of claim 1 wherein the step-up converter includes a power sensing circuit to measure the source voltage, and includes a power limiting circuit to reduce the power level of the input power signal if the source voltage falls below a threshold.

6. The power supply of claim 1 further comprising a step-down converter coupled between the energy storage element and the power output terminal, wherein the step-down converter receives power from the energy storage element at the storage voltage and provides output power signal at the power output terminal at a supply voltage, wherein the storage voltage is higher than the supply voltage.

7. A power supply comprising:
a power input terminal;
a first energy storage element for storing energy at a first storage voltage;
a second energy storage element for storing energy at a second storage voltage;
a two output step-up converter coupled to the power input terminal to receive an input power signal from a limited power source at a source voltage and to provide a first storage power signal to the first energy storage element at the first storage voltage and to provide a second storage power signal to the second energy storage element at a second storage voltage;
a power output terminal for providing an output power signal to a load, wherein the first energy storage element is coupled to the power output terminal;
and
a controller coupled to the load for receiving a load power signal indicating an amount of power required by the load and to selectively couple the second energy storage element to the power output terminal in response to the load power signal.

8. The power supply of claim 7 further comprising a switch for coupling the first and second energy storage elements such that when the switch is open, the output power signal is provided by the first energy storage element, and when the switch is closed, the output power signal is provided by both the first and second energy storage elements, and wherein the controller couples the second energy storage element to the power output terminal by closing the switch.

9. The power supply of claim 7 further comprising a load input signal terminal coupled to the load and the controller, wherein the load input signal terminal provides the load power signal to the controller.

* * * * *